(12) United States Patent
Wu

(10) Patent No.: US 6,570,214 B1
(45) Date of Patent: May 27, 2003

(54) SCALABLE STACK-GATE FLASH MEMORY CELL AND ITS CONTACTLESS MEMORY ARRAY

(76) Inventor: Ching-Yuan Wu, 1F, No.23, R&D RD.1, Science-Based Industrial Park, Hsinchu (TW)

(*) Notice: Subject to any disclaimer, the term of this patent is extended or adjusted under 35 U.S.C. 154(b) by 0 days.

(21) Appl. No.: 10/085,016

(22) Filed: Mar. 1, 2002

(51) Int. Cl.[7] .............................................. H01L 29/788
(52) U.S. Cl. ...................... 257/315; 257/314; 257/321; 438/257; 438/266
(58) Field of Search ................................ 257/239, 261, 257/298, 314–326; 438/257, 266, 201, 211, 216, 261, 268, 591, 593

(56) References Cited

U.S. PATENT DOCUMENTS

| | | | |
|---|---|---|---|
| 5,645,917 A | 7/1997 | Ejiri et al. | |
| 6,133,097 A | * 10/2000 | Hsieh et al. | 438/266 |
| 6,251,727 B1 | * 6/2001 | Chen | 438/257 |
| 6,380,583 B1 | * 4/2002 | Hsieh et al. | 257/314 |
| 6,436,764 B1 | * 8/2002 | Hsieh | 438/257 |

* cited by examiner

Primary Examiner—David Nelms
Assistant Examiner—Long Tran
(74) Attorney, Agent, or Firm—Lowe Hauptman

(57) ABSTRACT

A scalable stack-gate flash memory cell and its contactless memory array are disclosed by the present invention, in which the control-gate length and the implanted region of a scalable stack-gate flash memory cell are separately defined by two sidewall dielectric spacers formed over a sidewall on the common-source region and, therefore, can be controlled to be smaller than a minimum-feature-size of technology used; a contactless memory array comprises a plurality of common-source/drain conductive bus lines being formed alternately over the flat beds and a plurality of word lines together with the control-gates of scalable stack-gate flash memory cells being patterned and etched simultaneously by a set of hard masking layers are formed transversely to the plurality of common-source/drain conductive bus lines.

21 Claims, 13 Drawing Sheets

SCALABLE STACK-GATE FLASH MEMORY CELL AND ITS CONTACTLESS MEMORY ARRAY

FIELD OF THE INVENTION

The present invention relates generally to a stack-gate flash memory cell and its memory array and particularly to a scalable stack-gate flash memory cell and its contactless memory array.

DESCRIPTION OF THE RELATED ART

The stack-gate flash memory cell is known to be a one-transistor cell, in which the gate length of a cell can be defined by using a minimum-feature-size (F) of technology used. Therefore, the stack-gate flash memory cell is often used in existing high-density memory system. The stack-gate flash memory cells can be interconnected in series to form a high-density NAND-type array with common-source/drain diffusion regions. However, the read speed is relatively slow for a NAND-type array due to the series resistance of the configuration. Moreover, a NAND-type flash memory cell is programmed by Fowler-Nordheim tunneling across the thin tunneling-oxide layer between the floating-gate and the common-source/drain diffusion region and its programming speed is relatively slow. In addition, when the gate length of a stack-gate flash memory cell in a NAND-type array is further scaled down, the junction depth of common-source/drain diffusion regions must be scaled accordingly, and the overlapped region between the floating gate and the common-source/drain diffusion region becomes smaller, resulting in a further slow process for programming, reading and erasing.

The stack-gate flash memory cells can be connected with the common-source diffusion lines and the common-drain diffusion regions in each column being connected to a bit-line through contacts for a NOR-type flash memory array. The read speed of a NOR-type memory array is much faster as compared to that of a NAND-type flash memory array. A stack-gate flash memory cell in a NOR-type flash memory array is in general programmed by channel hot-electron injection and its programming speed is much faster than that of a NAND-type flash memory array; however, the programming power is large and the programming efficiency is low. Moreover, as the gate length of a stack-gate flash memory cell is further scaled, the punch-through effect becomes a major concern for channel hot-electron injection as a programming method. In addition, the cell size of a NOR-type flash memory array is about twice that of a NAND-type flash memory array due to the bit-line contacts.

A typical contactless flash memory array taking advantages of a NAND-type and a NOR-type architecture is shown in FIG. 1, in which a plurality of bit lines (BL0~BL6) are formed in parallel by using the common buried diffusion lines; the stack-gate flash memory cells (100~129) in each column are arranged between the bit lines; the control-gates in each row are connected to form a word line and a plurality of word lines are formed perpendicularly to the plurality of bit lines. It is clearly seen that the cell size of FIG. 1 can be made to be comparable with that of a NAND-type array due to the contactless structure used; the read speed of FIG. 1 is better than that of a NAND-type array and is inferior to that of a NOR-type array due to the larger bit-line capacitance with respect to the semiconductor substrate; and the programming speed of FIG. 1 is much faster than that of a NAND-type array and is comparable to that of a NOR-type array due to the channel hot-electron injection as a programming method. A typical example for implementing a high-density memory array shown in FIG. 1 may refer to U.S. Pat. No. 5,654,917. Basically, there are several issues appeared in the manufacture of this array architecture: the stack-gate structure in the channel-width direction must be etched to have an independent floating-gate for each cell without trenching the common buried diffusion bit-lines and the semiconductor substrate between the word lines; the isolation of cells between the neighboring word lines is performed by ion-implantation without increasing the buried bit-line junction capacitance and reducing the cell width; the gate length of the stack-gate flash memory cell is difficult to be scaled down further due to the punch-through effect; the junction depth of the common buried diffusion bit-lines can't be easily scaled down without increasing the bit-line resistance and further decreasing the read/erasing speed; and higher parasitic capacitance between the word lines and the common buried diffusion bit lines must be reduced.

SUMMARY OF THE INVENTION

A scalable stack-gate flash memory cell of the present invention is formed on a shallow-trench-isolation (STI) structure being formed on a semiconductor substrate of a first conductivity type. The shallow-trench-isolation structure comprises an active region being formed between two parallel STI regions, in which a first conductive layer being formed on a thin tunneling-dielectric layer is located in the active region and the raised filed-oxide (FOX) layer is formed on each of parallel STI regions. A scalable stack-gate flash memory cell can be divided into three regions: a common-source region, a gate region, and a common-drain region, in which the gate region is located between the common-source region and the common-drain region. The gate region comprises a stack-gate structure with its gate length being defined by a fourth sidewall dielectric spacer formed over a sidewall of the common-source region and is further divided into two subregions: a low threshold-voltage stack-gate region and a high threshold-voltage stack-gate region, in which the low threshold-voltage stack-gate region comprises a stack-gate transistor being formed on a low doping semiconductor substrate with a stack-gate length being defined by a third sidewall dielectric spacer formed over the same sidewall of the common-source region; the high threshold-voltage stack-gate region comprises a stack-gate transistor being formed on an implanted semiconductor substrate and is located near the common-drain region. An implanted region being formed under the thin tunneling-dielectric layer of a high threshold-voltage stack-gate region comprises a shallow implant region of a first conductivity type for threshold-voltage adjustment and a deep implant region of a first conductivity type for forming a punch-through stop. The common-source region comprises a common-source diffusion region of a second conductivity type being implanted with doping impurities in a self-aligned manner into a semiconductor substrate of the active region, a first flat bed being formed by a common-source diffusion region and the first etched raised field-oxide layers, a first sidewall dielectric spacer being formed over a sidewall of the gate region and on a portion of the first flat bed, a common-source conductive bus line capped with a first metal-silicide layer being formed over the first flat bed outside of the first sidewall dielectric spacer, and a first planarized thick-oxide layer being formed over the first sidewall dielectric spacer and the first metal-silicide layer. The common-drain region comprises a common-drain diffusion region of a second conductivity type being implanted with doping impurities in a self-aligned manner into a semiconductor substrate of the active region, a second flat bed being formed by a common-drain diffusion region and the second etched raised field-oxide layers, a second sidewall dielectric spacer being formed over a sidewall of the gate region and on a portion of the second flat bed, a common-drain conductive bus line capped with a second metal-silicide layer being formed over the second flat bed outside of the second sidewall dielectric spacer, and a second planarized thick-oxide layer being formed over the second sidewall dielectric spacer and the second metal-silicide layer. The control gate together with a first interconnect metal layer being acted as a word line is patterned transversely to the common-source/drain conductive bus line and etched simultaneously by a hard masking layer being formed by a masking dielectric layer being aligned above the active region and its two sidewall dielectric spacers.

A contactless scalable stack-gate flash memory array of the present invention comprises a plurality of parallel shallow-trench-isolation (STI) regions and a plurality of active regions being formed alternately on a semiconductor substrate of a first conductivity type, wherein each of the plurality of parallel STI regions is filled with a raised field-oxide layer and each of the plurality of active regions is filled with a floating-gate layer being formed on a thin tunneling-dielectric layer; a plurality of virtual gate regions and a plurality of common-source bus-line regions being alternately formed by a masking photoresist step and being transversely to the plurality of parallel STI regions, wherein each of the plurality of virtual gate regions is divided into three regions: two scalable stack-gate regions being located in each side portion and a common-drain region being located between the two scalable stack-gate regions; and a plurality of word lines being formed transversely to the plurality of common-source/drain bus-line regions and above the plurality of active regions, wherein each of the plurality of word lines is connected to the control-gates of the scalable stack-gate regions in each row. The scalable stack-gate region comprises a plurality of scalable stack-gate flash memory cells in each column, wherein each of the plurality of scalable stack-gate flash memory cells is affordmentioned. Each of the plurality of common-source bus-line regions comprises a plurality of common-source diffusion regions of a second conductivity type being formed by implanting doping impurities in a self-aligned manner into the semiconductor substrate of the plurality of active regions along the common-source bus-line region; a first flat bed being formed alternately by a common-source diffusion region and a first etched raised field-oxide layer; a pair of first sidewall dielectric spacers being formed over the sidewalls of the neighboring virtual gate regions and on a portion of the first flat bed; a common-source conductive bus line being formed over the first flat bed between the pair of first sidewall dielectric spacers; a first metal-silicide layer being formed over the common-source conductive bus line; and a first planarized thick-oxide layer being formed over the first metal-silicide layer and the pair of first sidewall dielectric spacers. The common-drain bus-line region comprises a plurality of common-drain diffusion regions of a second conductivity type being formed by implanting doping impurities in a self-aligned manner into the semiconductor substrate of the plurality of active regions along each of the common-drain bus-line regions; a second flat bed being formed alternately by a common-drain diffusion region and a second etched raised field-oxide layer; a pair of second sidewall dielectric spacers being formed over the sidewalls of the neighboring scalable stack-gate regions and on a portion of the second flat bed; a common-drain conductive bus line being formed over the second flat bed between the pair of second sidewall dielectric spacers; a second metal-silicide layer being formed over the common-drain conductive bus line; and a second planarized thick-oxide layer being formed over the second metal-silicide layer and the pair of second sidewall dielectric spacers. Each of the plurality of word lines comprises a first interconnect metal layer being integrated with a plurality of control-gates in each row and is patterned and etched simultaneously with the plurality of control-gates by a hard masking layer being formed by a masking dielectric layer being aligned to the active region and its two sidewall dielectric spacers.

BRIEF DESCRIPTION OF THE DRAWINGS

FIG. 2A through FIG. 2G show the schematic diagrams of a scalable stack-gate flash memory cell and its contactless memory array of the present invention, in which FIG. 2A shows a schematic circuit diagram of a contactless scalable stack-gate flash memory array of the present invention; FIG. 2B shows a top plan view of a contactless scalable stack-gate flash memory array of the present invention; FIG. 2C(a) shows a cross-sectional view of a scalable stack-gate flash memory cell with a double-diffused drain structure along A–A' direction shown in FIG. 2B; FIG. 2C(b) shows a cross-sectional view of a scalable stack-gate flash memory cell with an implanted region under a portion of the gate region along A–A' direction shown in FIG. 2B. FIG. 2D shows a cross-sectional view along B–B' direction shown in FIG. 2B; FIG. 2E shows a cross-sectional view along C–C' direction shown in FIG. 2B; FIG. 2F shows a cross-sectional view along D–D' direction shown in FIG. 2B; and FIG. 2G shows a cross-sectional view along E–E' direction shown in FIG. 2B.

DETAILED DESCRIPTION OF THE PREFERRED EMBODIMENTS

Figure 1:
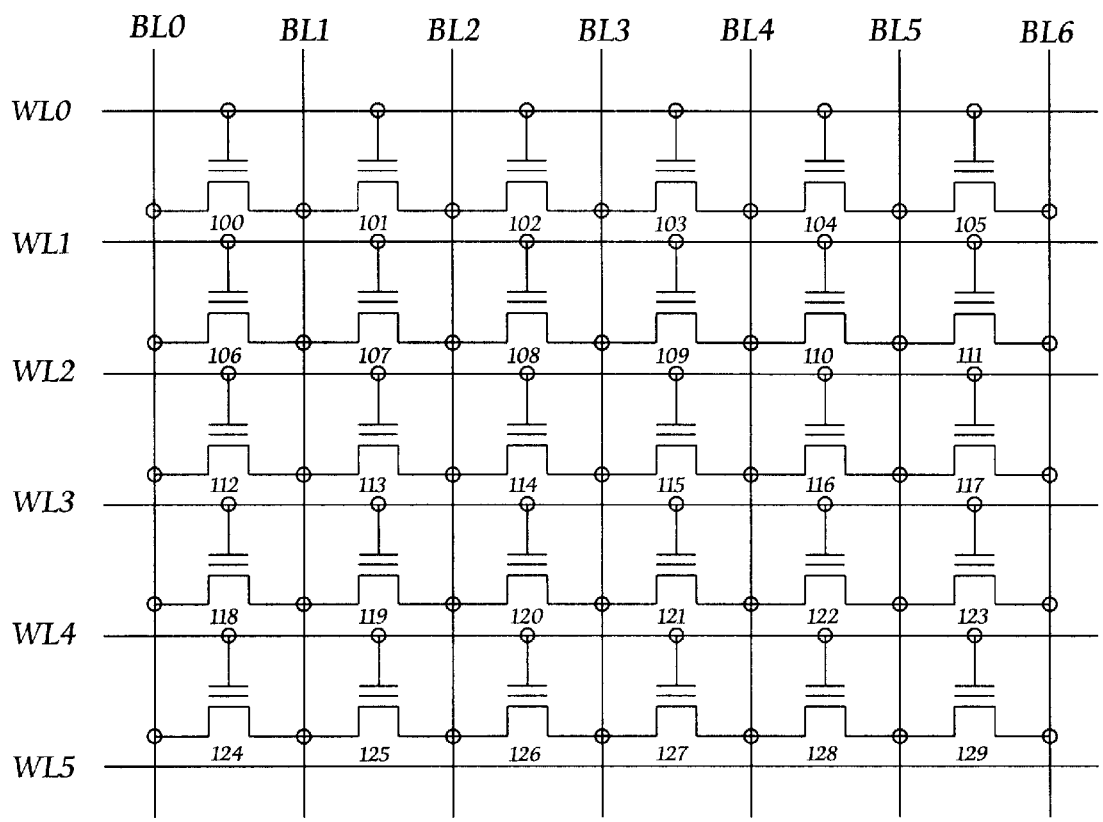
FIG. 1 shows a schematic circuit diagram of a stack-gate flash memory array of the prior art.
Figure 2A:
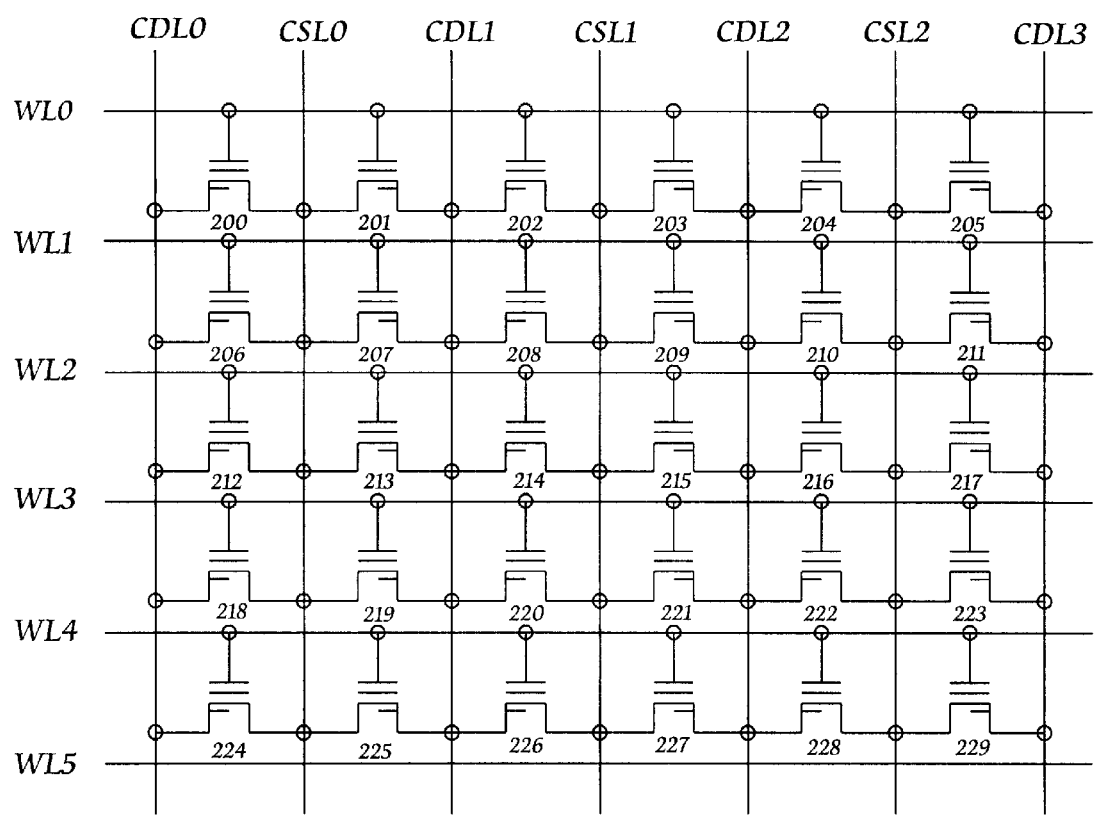

Referring now to FIG. 2A, there is shown a schematic circuit diagram of a contactless scalable stack-gate flash memory array of the present invention, in which a plurality of common-source conductive bus lines (CSL0~CSL2) and a plurality of common-drain conductive bus lines (CDL0~CDL3) are formed alternately; a plurality of paired scalable stack-gate flash memory cells are formed between the neighboring common-source conductive bus lines and a common-drain conductive bus line is formed between the plurality of paired scalable stack-gate flash memory cells, and the low threshold-voltage stack-gate regions of the plurality of paired scalable stack-gate flash memory cells are separately faced to the neighboring common-source conductive bus lines; a plurality of word lines are formed transversely to the plurality of common-source/drain conductive bus lines with the control-gates of the plurality of paired scalable stack-gate flash memory cells in each row being connected to a word line.

Figure 2B:
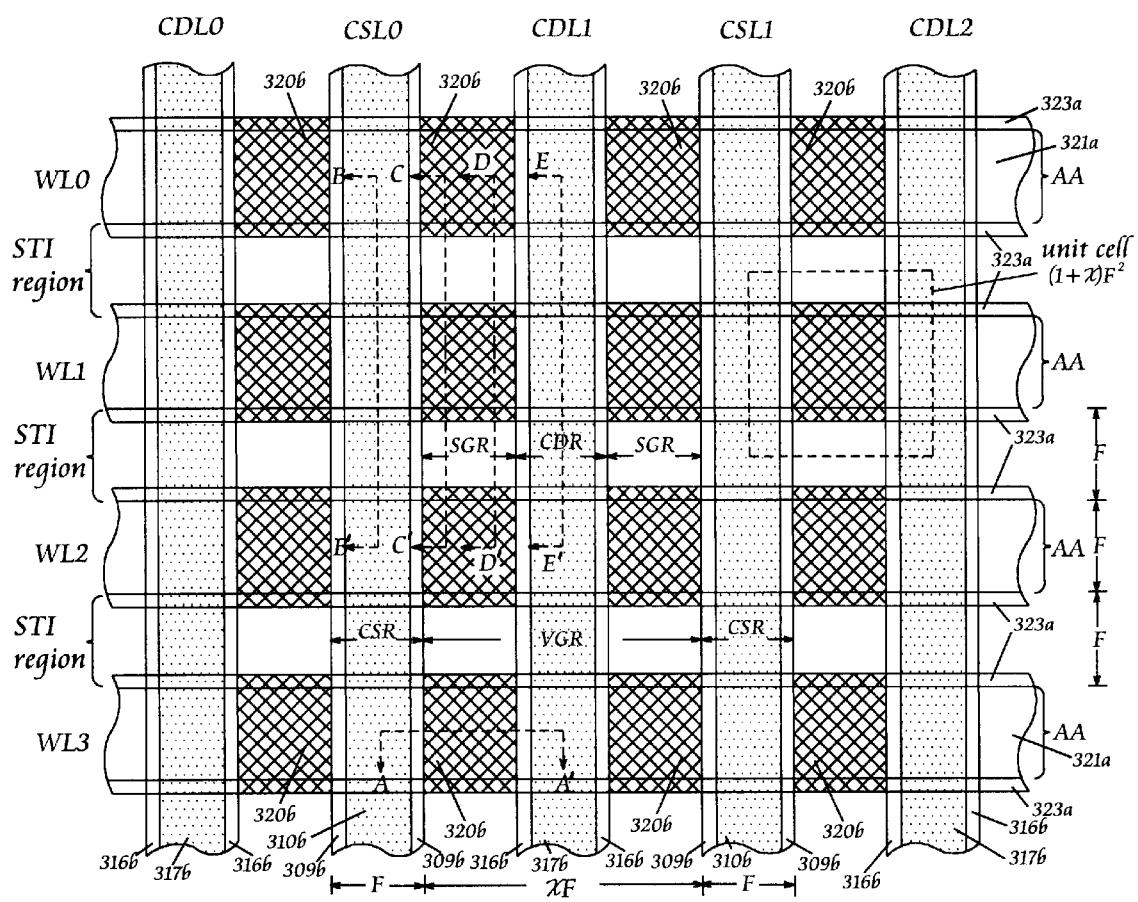

FIG. 2B shows a top plan view of a contactless scalable stack-gate flash memory array of the present invention. As shown in FIG. 2B, a plurality of parallel shallow-trench-isolation (STI) regions and a plurality of active regions (AA) are formed alternately on a semiconductor substrate 300 of a first conductivity type, wherein each of the plurality of parallel STI regions is filled with a raised field-oxide layer 304b and each of the plurality of active regions is filled with a floating-gate layer 302a being formed on a thin tunneling-dielectric layer 301a; a plurality of common-source bus-line regions (CSR) and a plurality of virtual gate regions (VGR) are alternately formed and are transversely to the plurality of parallel STI regions, in which each of the plurality of virtual gate regions (VGR) is defined by a masking photoresist step with a scalable width XF and each of the plurality of common-source bus-line regions (CSR) is defined to have a width F; each of the plurality of virtual gate regions (VGR) comprises two scalable stack-gate regions (SGR) being separately located in each side portion and a common-drain bus-line region (CDR) being located between the scalable stack-gate regions (SGR); and a plurality of word lines (WL0~WL3) being located transversely to the plurality of common-source/drain bus-line regions are formed above the plurality of active regions with each of the plurality of word lines being connected to the control-gates of scalable stack-gate regions (SGR) in each row. More detailed cross-sectional structure can be seen from FIG. 2C through FIG. 2G as will be discussed below.

Figure 2C:
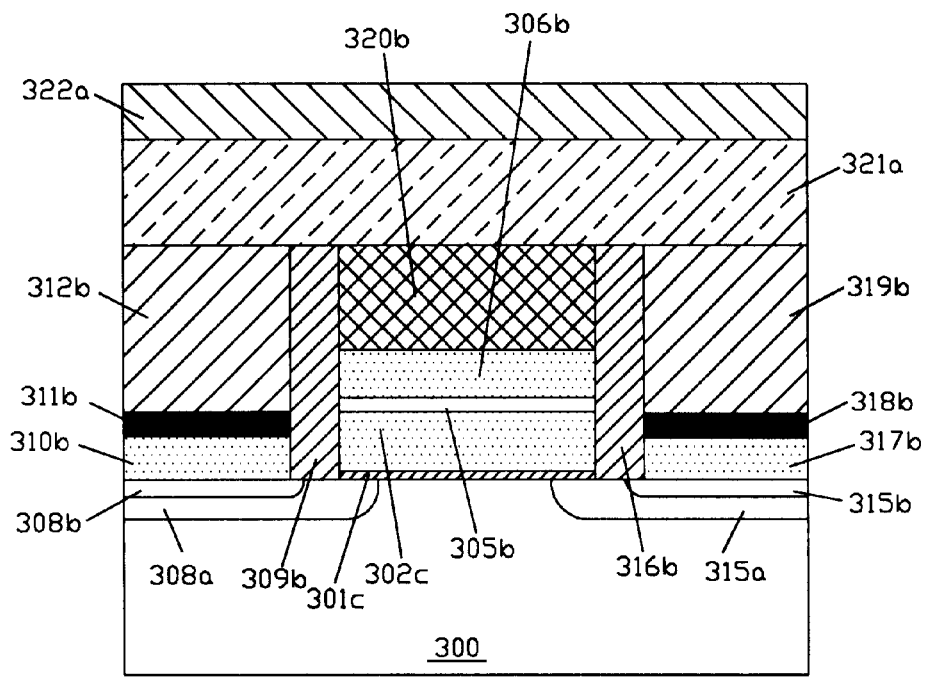
Figure 2C:
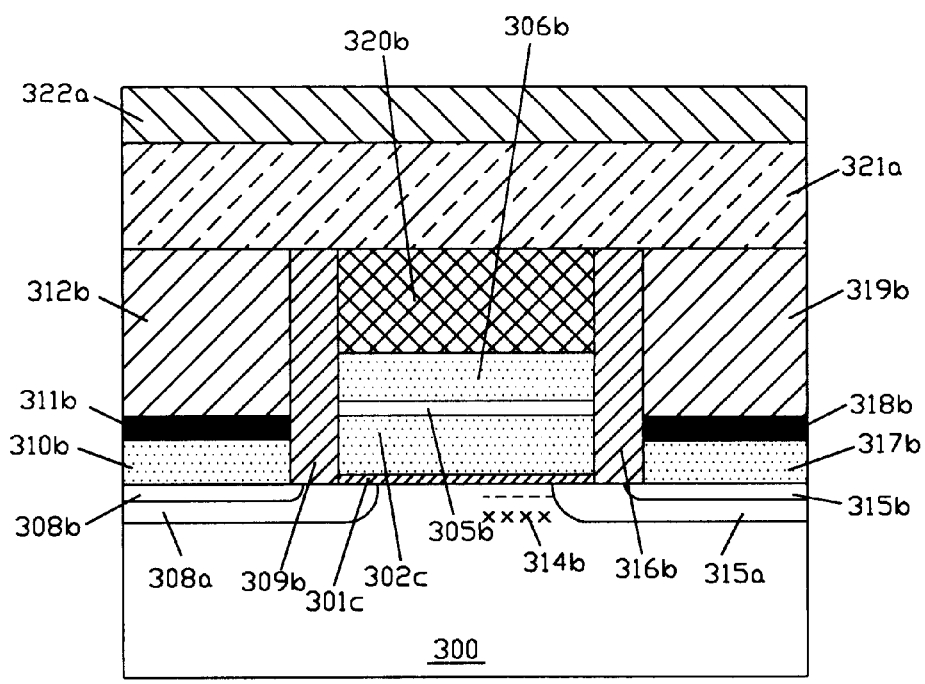

FIG. 2C shows a cross-sectional view along A–A' direction shown in FIG. 2B, in which FIG. 2C(a) shows a cross-sectional view of a scalable stack-gate flash memory cell with a double-diffused drain structure 315a and FIG. 2C(b) shows a cross-sectional view of a scalable stack-gate flash memory cell with an implanted region 314b under a portion of the gate region. From FIG. 2C(a) and FIG. 2C(b), a common-source bus-line region comprises a common-source diffusion region of a second conductivity type having a shallow heavily-doped diffusion region 308b formed within a deeper lightly-doped diffusion region 308a, a pair of first sidewall-dielectric spacers 309b (see also FIG. 2B) being formed over each sidewall of the neighboring virtual gate regions and on a portion of a first flat bed being formed alternately by a common-source diffusion region and a first etched raised field-oxide layer 304c (see FIG. 2D), a common-source conductive bus line 310b capped with a first metal-silicide layer 311b being formed on the first flat bed between the pair of first sidewall dielectric spacers 309b, and a first planarized thick-oxide layer 312b being formed over the first metal-silicide layer 311b and the pair of first sidewall dielectric spacers 309b. The scalable stack-gate region (SGR) comprises a plurality of composite control-gates with each control-gate being consisting of a planarized conductive control-gate 306c capped with a metal-silicide layer 320b or a metal layer 320b, and is divided into two subregions shown in FIG. 2C(b): a low threshold-voltage stack-gate region and a high threshold-voltage stack-gate region. The low threshold-voltage stack-gate region comprises a stack-gate transistor being formed on a low doping semiconductor substrate 300. The high threshold-voltage stack-gate region comprises a stack-gate transistor being formed on an implanted region 314b of a first conductivity type having a shallow implant region (as marked by dash lines) for threshold-voltage adjustment and a deep implant region (as marked by cross symbols) for forming a punch-through stop. The common-drain bus-line region (CDR) comprises a common-drain diffusion region of a second conductivity type having a shallow heavily-doped diffusion region 315b formed within a deep heavily-doped diffusion region 315a for FIG. 2C(b) and a shallow heavily-doped diffusion region 315b of a second conductivity type formed within a double-diffused structure 315a having a heavily-doped diffusion region of a second conductivity-type formed within a lightly-doped or moderately-doped diffusion region of a first conductivity type for FIG. 2C(a), a pair of second sidewall dielectric spacers 316b being separately formed over each sidewall of the neighboring scalable stack-gate regions and on a portion of a second flat bed being formed alternately by a common-drain diffusion region and a second etched raised field-oxide layer 304d, a common-drain conductive bus line 317b capped with a second metal-silicide layer 318b, and a second planarized thick-oxide layer 319b being formed over the second metal-silicide layer 318b and the pair of second sidewall dielectric spacers 316b. The shallow heavily-doped diffusion regions 308b, 315b can be formed by using the heavily-implanted common-source/drain conductive bus lines 310b, 317b as the dopant diffusion sources. A first interconnect metal layer 321a is formed over the formed structure and a hard masking layer including a masking dielectric layer 322a and its two sidewall dielectric spacers 323a (see FIG. 2D through FIG. 2G) is formed over the first interconnect metal layer 321a and is acted as a mask to simultaneously pattern and etch the first interconnect metal layer 321a and the composite control-gate layer 320b, 306b for forming a word line.

Figure 2D:
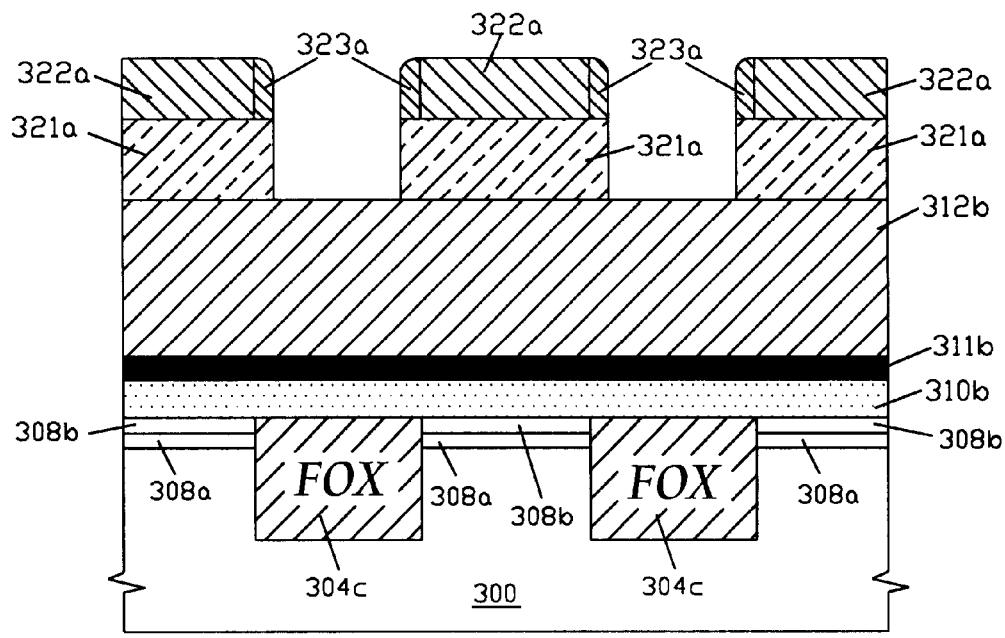

FIG. 2D shows a cross-sectional view along a common-source bus-line region (B–B') shown in FIG. 2B, in which a common-source conductive bus line 310b capped with a first metal-silicide layer 311b is formed over a first flat bed being alternately formed by a first etched raised field-oxide layer 304c and a common-source diffusion region having a shallow heavily-doped diffusion region 308b formed within a deep lightly-doped diffusion region 308a. A first planarized thick-oxide layer 312b is formed over the first metal-silicide layer 311b, and a plurality of word lines 321a being formed over the first planarized thick-oxide layer 312b are patterned and etched by a plurality of masking dielectric layers 322a being formed above the plurality of active regions and their sidewall dielectric spacers 323a.

Figure 2E:
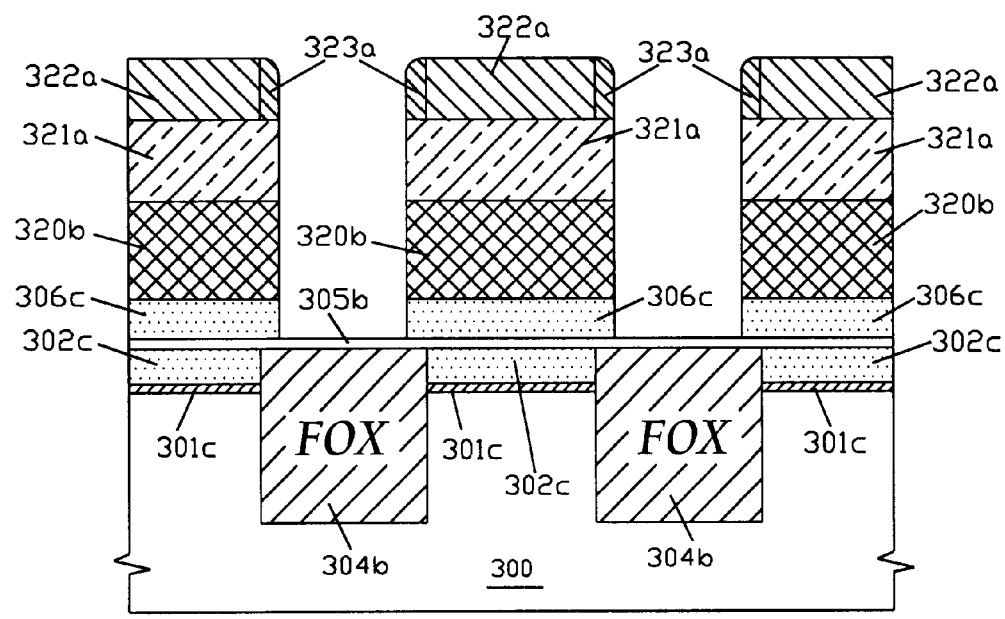

FIG. 2E shows a cross-sectional view along a low threshold-voltage stack-gate region (C–C') shown in FIG. 2B, in which each of floating-gate layers 302c is formed on a thin tunneling-dielectric layer 301c with its width being defined by the neighboring raised field-oxide layers 304b; an intergate dielectric layer 305b is formed over a flat bed being alternately formed by a raised field-oxide layer 304b and a floating-gate layer 302c; a plurality of composite control-gates (320b and 306c) being formed in the plurality of low threshold-voltage stack-gate regions and a plurality of word lines 321a are simultaneously patterned and etched by a set of hard mask layers as described in FIG. 2D.

Figure 2F:
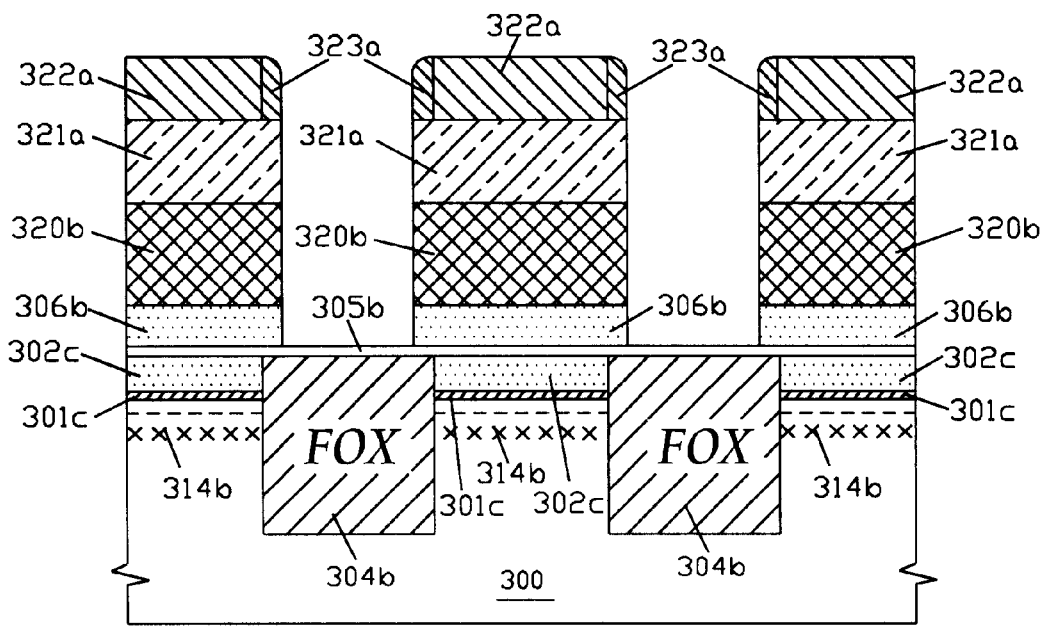

FIG. 2F shows a cross-sectional view along a high threshold-voltage stack-gate region (D–D') shown in FIG. 2B, in which a floating-gate layer 302c being formed on a thin tunneling-dielectric layer 301c is formed between the neighboring raised field-oxide layers 304b and an implanted region 314b of a first conductivity-type being formed by a shallow implant region (as marked by dash lines) and a deeper implant region (as marked by cross symbols) is located under the thin tunneling-dielectric layer 301c; a plurality of composite control-gates (320b and 306c) being formed in the plurality of high threshold-voltage stack-gate regions and a plurality of word lines 321a are simultaneously patterned and etched by using a plurality of hard masking layers with each hard masking layer being formed by a masking dielectric layer 322a and its two sidewall dielectric spacers 323a.

Figure 2G:
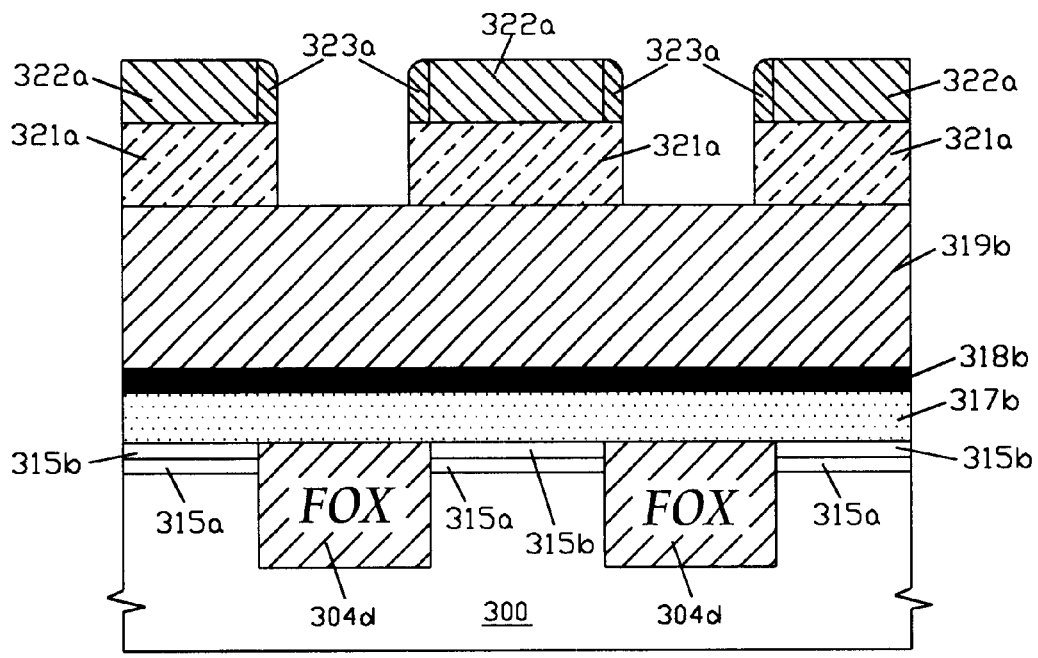

FIG. 2G shows a cross-sectional view along a common-drain bus-line region (E–E') shown in FIG. 2B, in which a common-drain conductive bus line 317b capped with a second metal-silicide layer 318b is formed over a second flat bed being alternately formed by a common-drain diffusion region having a shallow heavily-doped diffusion region 315b of a second conductivity type formed within a heavily-doped diffusion region 315a of a second conductivity type or a double-diffused structure 315a having a heavily-doped diffusion region of a second conductivity type within a lightly-doped or moderately-doped diffusion region of a first conductivity type and a second etched raised field-oxide layer 304d; a second planarized thick-oxide layer 319b is formed over a second metal-silicide layer 318b; and a plurality of word lines 321a being patterned and etched by using a plurality of hard masking layers with each hard masking layer being formed by a masking dielectric layer 322a and its two sidewall dielectric spacers 323a.

From FIG. 2E and FIG. 2F, it is clearly seen that the masking dielectric layer 322a is aligned above the active region and its two sidewall dielectric spacers 323a are mainly used to eliminate the misalignment between the masking dielectric layer 322a and the active region. From FIG. 2B, the unit cell of a scalable stack-gate flash memory cell in an array as marked by a dash square is equal to $(1+X)F^2$, where X is a scaling factor and is preferably $1 \leq X \leq 3$. For example, X=3, the cell size is $4F^2$; X=1, the cell size is $2F^2$.

As shown in FIG. 2A, a scalable stack-gate flash memory cell in an array can be programmed and read by a method comprising: a first voltages applied to a common-source conductive bus line of the selected cell and a second voltage is applied to a common-drain conductive bus line of the selected cell; the second voltage is also applied to the common-source/drain conductive bus lines in the same side of the common-drain conductive bus line and the first voltage is also applied to the common-drain/source bus lines in the same side of the common-source conductive bus line; and a third voltage is applied to a word line of the selected cell and a ground voltage is applied to the other word lines. For programming, the first voltage is 0 volts (grounded), the second voltage is about 3.0~8.0 volts, and the third voltage is slightly above the threshold voltage of the high-threshold-voltage stack-gate transistor region; for reading, the first voltage is 0 volts, the second voltage is about 1.0~15 volts, and the third voltage is about 6.0~8.0 volts. It should be noted that the applied voltages for the first voltage and the second voltage can be reversed for reading.

From FIG. 2C, the scalable stack-gate flash memory cell can be erased by tunneling stored electrons in the floating-gate to the common-source diffusion region through a thin tunneling-dielectric layer. Therefore, a first voltage of about 8~14 volts is applied to all of the common-source conductive bus lines and a third voltage of 0 volts (grounded) is applied to a word line to simultaneously erase the cells near the common-source conductive bus lines and under the word line. The other word lines and all of the common-drain conductive bus lines can be applied with the first voltage. By the way, a first voltage of 814 volts is applied to all of the common-source/drain conductive bus lines and a third voltage of 0 volts is applied to all of the word lines, all of the cells in an array can be simultaneously erased by tunneling stored electrons in the floating-gate to the common-source diffusion regions of the cells. It is clearly seen that a single voltage with one polarity is needed to do erasing process.

Based on the above description, the features and advantages of the scalable stack-gate flash memory cell and its contactless memory array of the present invention can be summarized below:

(a) The contactless scalable stack-gate flash memory array of the present invention offers the common-source/drain conductive bus lines with much lower bus-line resistance and much lower bus-line parasitic capacitance with respect to the semiconductor substrate as compared to the buried diffusion lines of the prior arts.

(b) The contactless scalable stack-gate flash memory array of the present invention offers a shallow-trench-isolation structure for the cells in different word lines without producing doping encroachment and increasing the parasitic junction capacitances of the common-source/drain conductive bus lines.

(c) The contactless scalable stack-gate flash memory array of the present invention offers a high-conductivity metal layer for a word line and a lower parasitic capacitances between the word line and the common-source/drain conductive bus lines as compared to the prior arts.

(d) The scalable stack-gate flash memory cell of the present invention may offer a cell size smaller than $4F^2$.

(e) The scalable stack-gate flash memory cell in an array of the present invention can be operated with higher read speed and higher programming efficiency with controllable punch-through effects as compared to the stack-gate flash memory cell in a similar array.

Figure 3A:
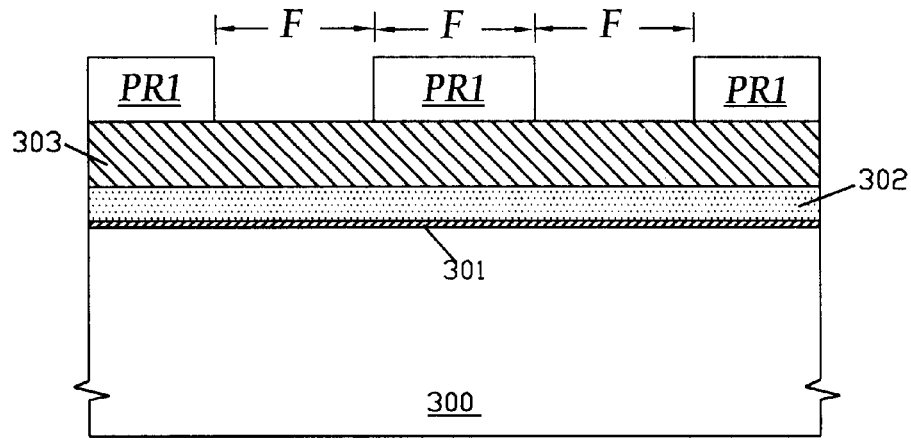
FIG. 3A through FIG. 3F show the process steps and their cross-sectional views of fabricating a shallow-trench-isolation structure for a contactless scalable stack-gate flash memory array of the present invention.

Referring now to FIG. 3A through FIG. 3F, there are shown the process steps and their cross-sectional views of fabricating a shallow-trench-isolation (STI) structure for a contactless scalable stack-gate flash memory array of the present invention. FIG. 3A shows that a thin tunneling-dielectric layer 301 is formed over a semiconductor substrate 300 of a first conductivity type; a first conductive layer 302 is formed over the thin tunneling-dielectric layer 301; a first masking dielectric layer 303 is then formed over the first conductive layer 302; and a plurality of patterned masking photoresist PR1 are formed over the first masking dielectric layer 303 to define a plurality of active regions (under PR1) and a plurality of parallel shallow-trench-isolation (STI) regions (between PR1). The thin tunneling-dielectric layer 301 is preferably a thermal-oxide layer or a nitrided thermal-oxide layer and its thickness is preferably between 60 Angstroms and 150 Angstroms. The first conductive layer 302 is preferably a doped polycrystalline-silicon layer or a doped amorphous-silicon layer as deposited by low-pressure chemical-vapor-deposition (LPCVD) and its thickness is preferably between 500 Angstroms and 1500 Angstroms. The first masking dielectric layer 303 is preferably a silicon-nitride layer as deposited by LPCVD and its thickness is preferably between 500 Angstroms and 2000 Angstroms. As shown in FIG. 3A, the width and the space of PR1 can be defined to be a minimum-feature-size (F) of the technology used.

Figure 3B:
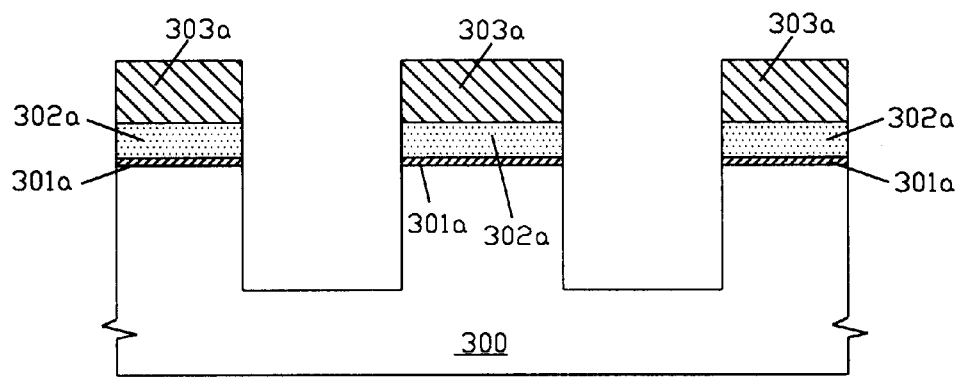

FIG. 3B shows that the first masking dielectric layer 303, the first conductive layer 302, and the thin tunneling-dielectric layer 301 outside of PR1 are anisotropically removed and then the semiconductor substrate 300 is anisotropically etched to form a plurality of shallow trenches, then the patterned masking photoresist PR1 are stripped. The depth of shallow trenches is preferably between 3000 Angstroms and 8000 Angstroms.

Figure 3C:
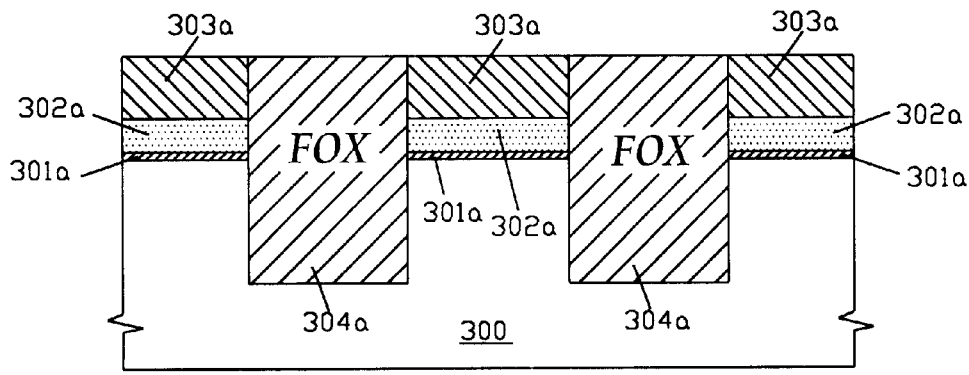

FIG. 3C shows that the planarized field-oxide layers 304a are formed to fill up the gaps. The planarized field-oxide layer 304a is formed by first depositing a thick-oxide layer 304 over the whole structure and then planarizing the deposited thick-oxide layer 304 using chemical-mechanical polishing (CMP) with the first masking dielectric layer 303a as a polishing stop. The planarized field-oxide layer 304a is preferably made of silicon-oxides or phosphosilicate glass (PSG), as deposited by high-density plasma CVD or CVD.

Figure 3D:
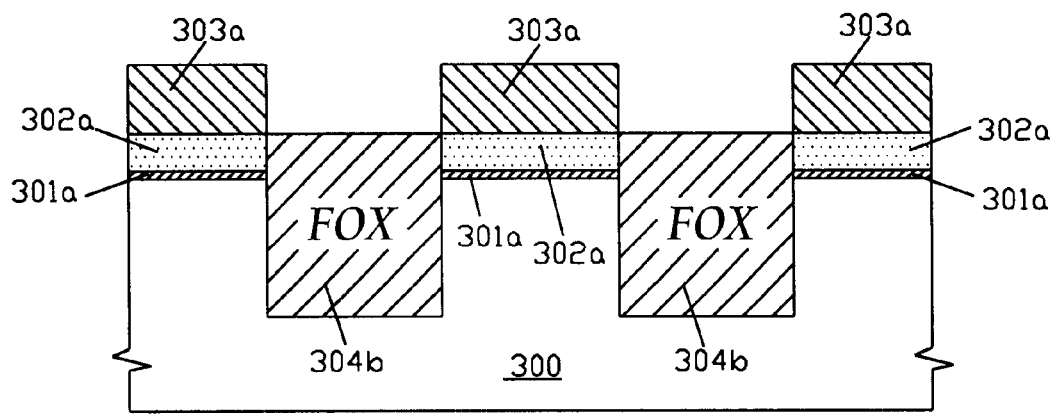

FIG. 3D shows that the planarized field-oxide layers 304a are anisotropically etched back to a depth approximately equal to the thickness of the first masking dielectric layer 303a to form the raised field-oxide layers 304b.

Figure 3E:
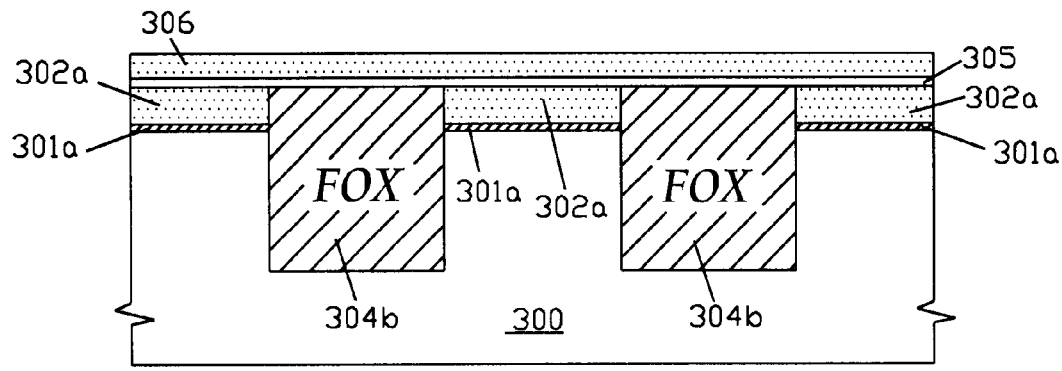

FIG. 3E shows that the first masking dielectric layers 303a are removed by using hot-phosphoric acid or anisotropic dry etching; an intergate dielectric layer 305 is formed over a flat surface being alternately formed by a raised field-oxide layer 304b and a first conductive layer 302a and then a second conductive layer 306 is formed over the intergate dielectric layer 305. The intergate dielectric layer 305 is preferably a silicon-oxide layer or an oxide-nitride-oxide (ONO) structure. The silicon-oxide layer is preferably formed by high-temperature-oxide (HTO) deposition or is a thermal poly-oxide layer and its thickness is preferably between 100 Angstroms and 300 Angstroms. The equivalent oxide thickness of an oxide-nitride-oxide structure is preferably between 80 Angstroms and 200 Angstroms. The second conductive layer 306 is preferably a doped polycrystalline-silicon or doped amorphous-silicon layer as deposited by LPCVD and its thickness is preferably between 500 Angstroms and 1500 Angstroms. It should be emphasized that the surface shown in FIG. 3E is formed to be flat for fine-line lithography later on.

Figure 3F:
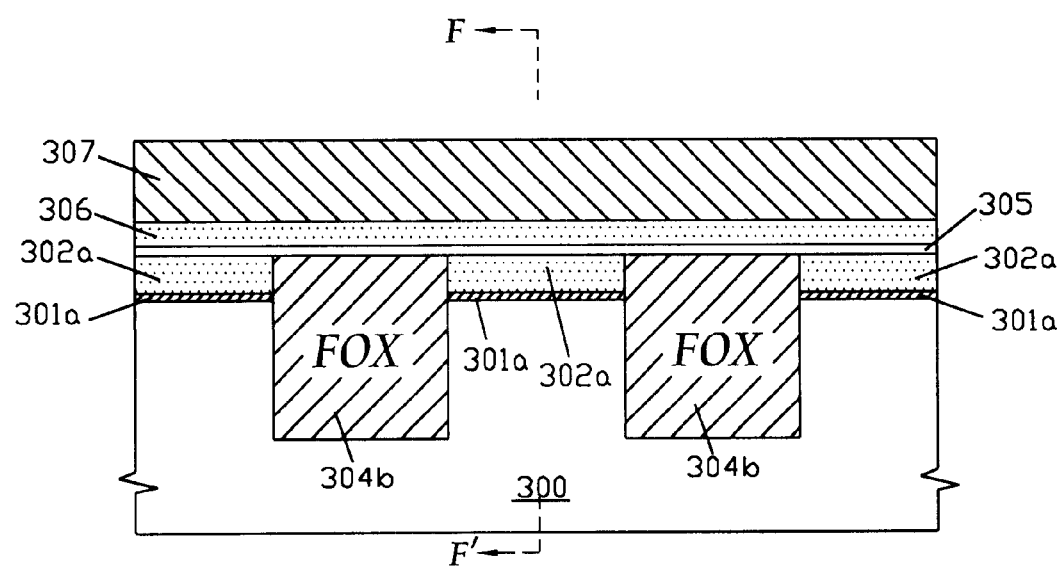

FIG. 3F shows that a second masking dielectric layer 307 is formed over the second conductive layer 306. The second masking dielectric layer 307 is preferably a silicon-nitride layer as deposited by LPCVD and its thickness is preferably between 3000 Angstroms and 5000 Angstroms. A cross-sectional view along the active region (F–F') shown in FIG. 3F is shown in FIG. 4A.

Figure 4A:
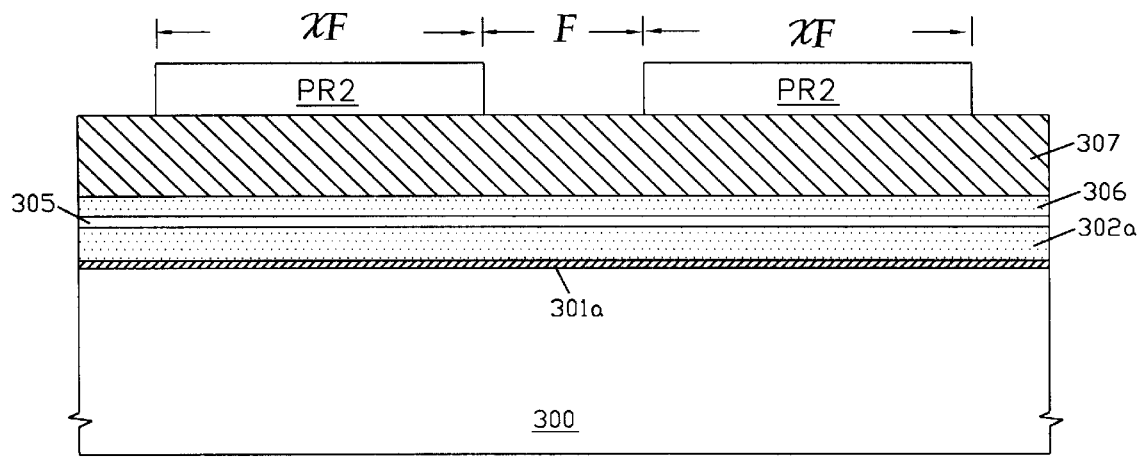
FIG. 4A through FIG. 4N show the process steps and their cross-sectional views for forming a contactless scalable stack-gate flash memory array of the present invention.
Figure 4B:
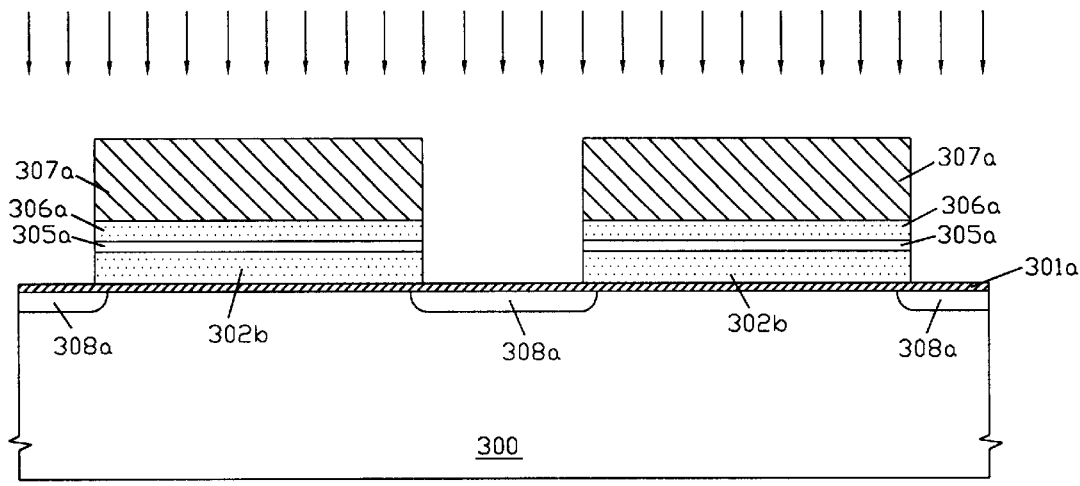
Figure 4C:
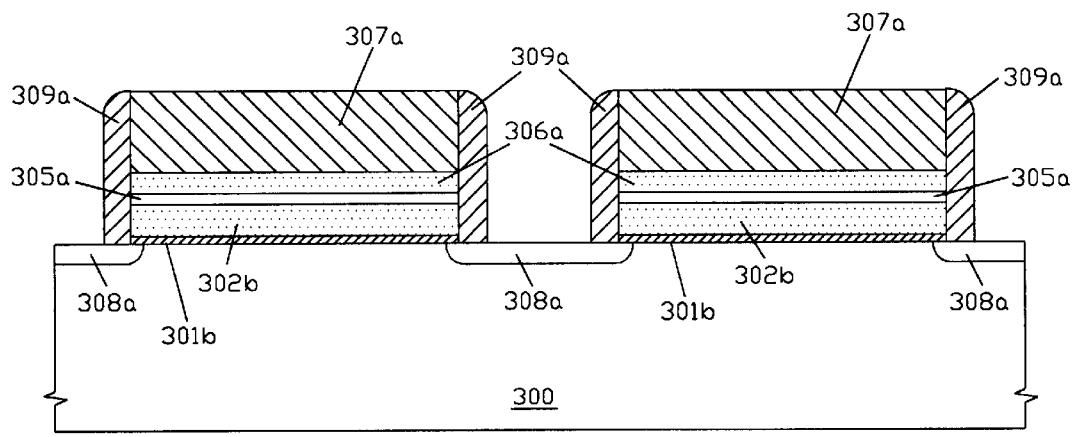
Figure 4D:
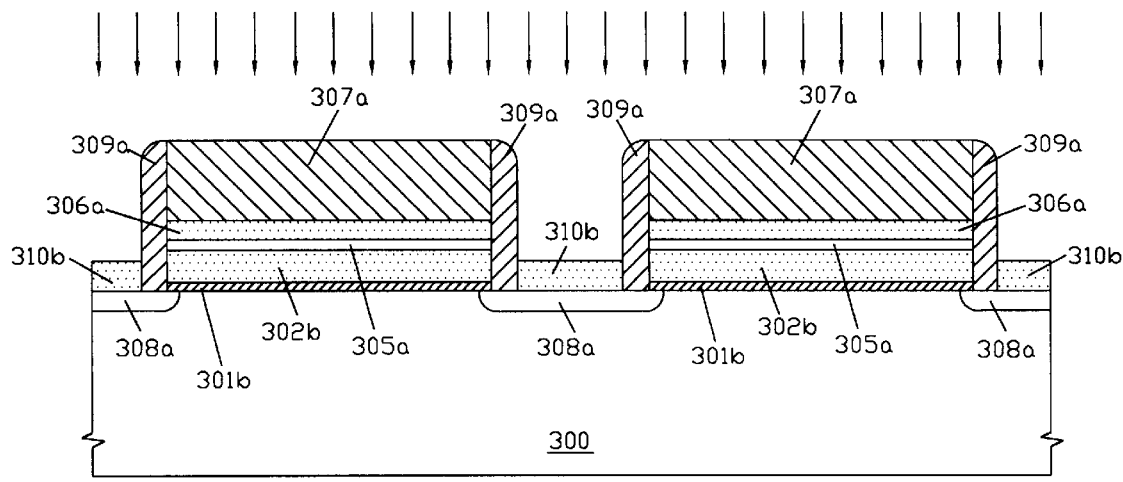
Figure 4E:
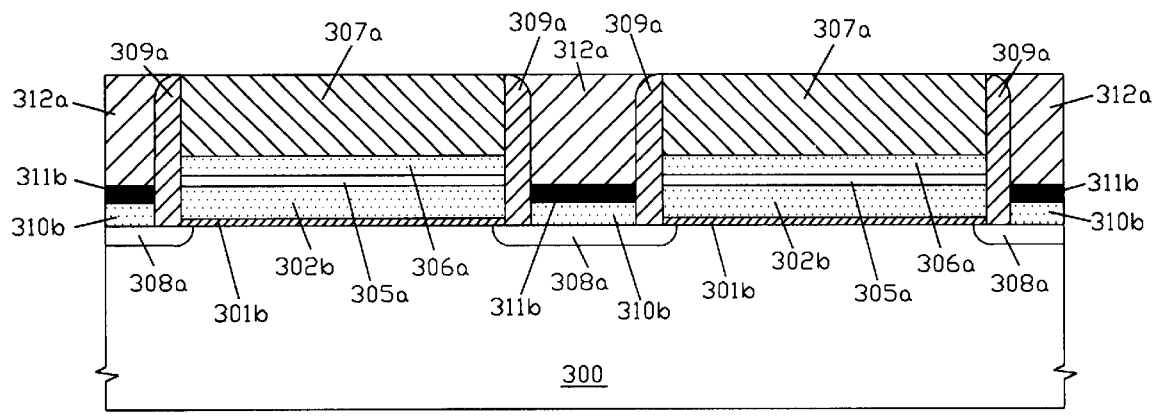
Figure 4F:
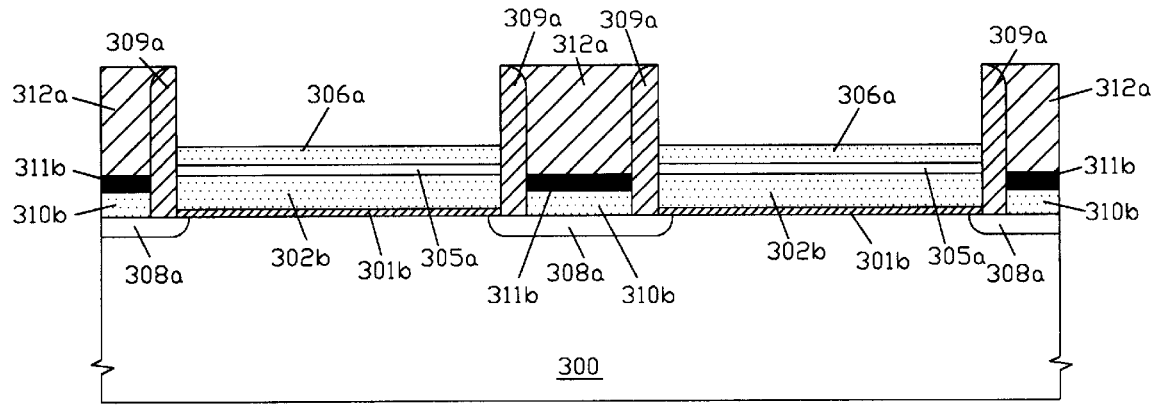
Figure 4G:
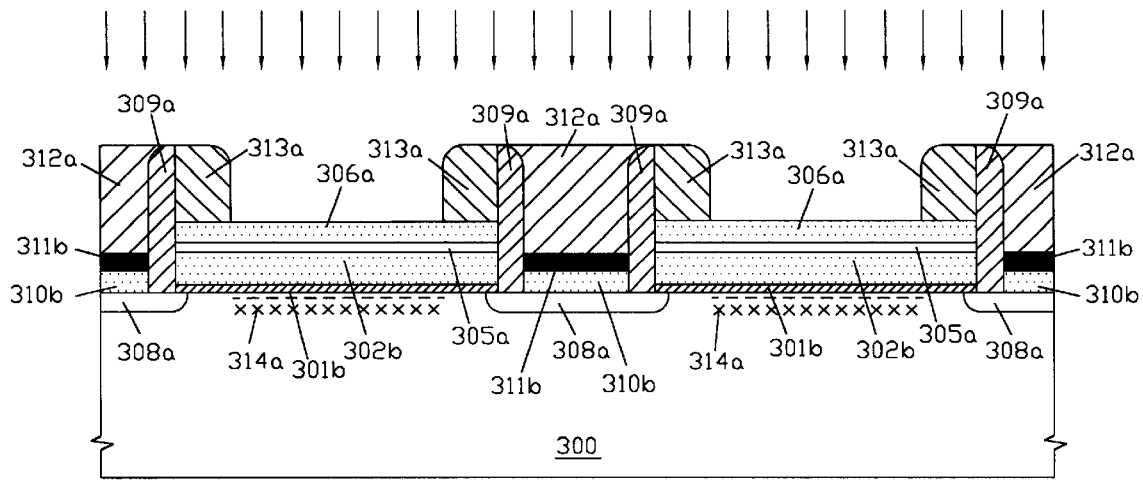
Figure 4H:
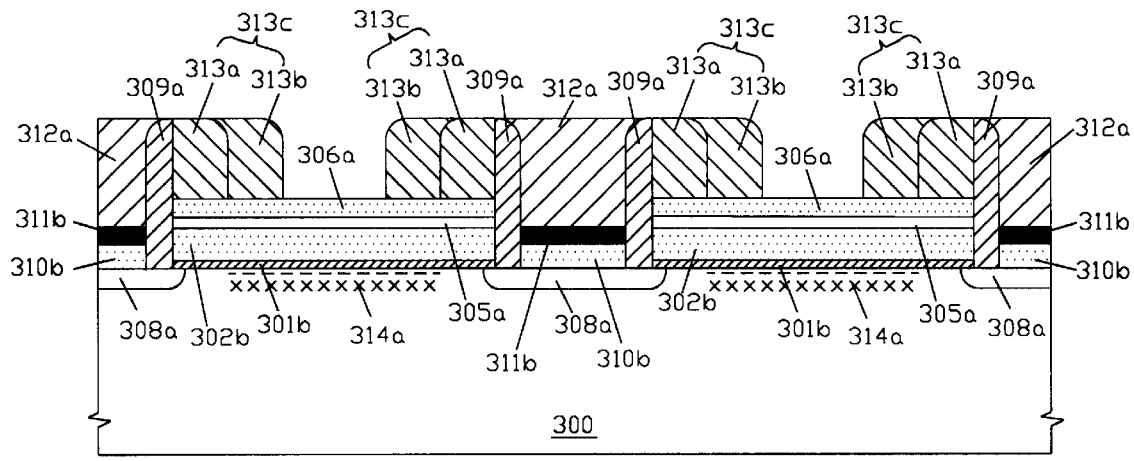
Figure 4H:
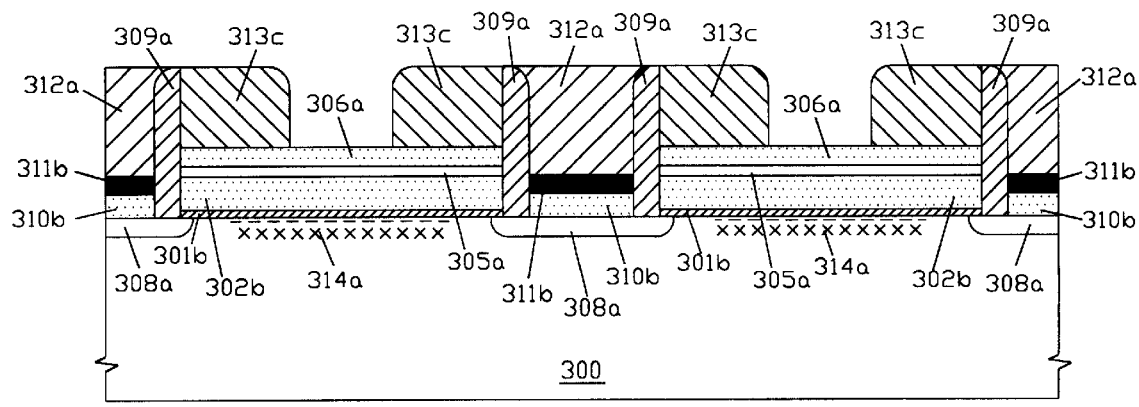
Figure 4I:
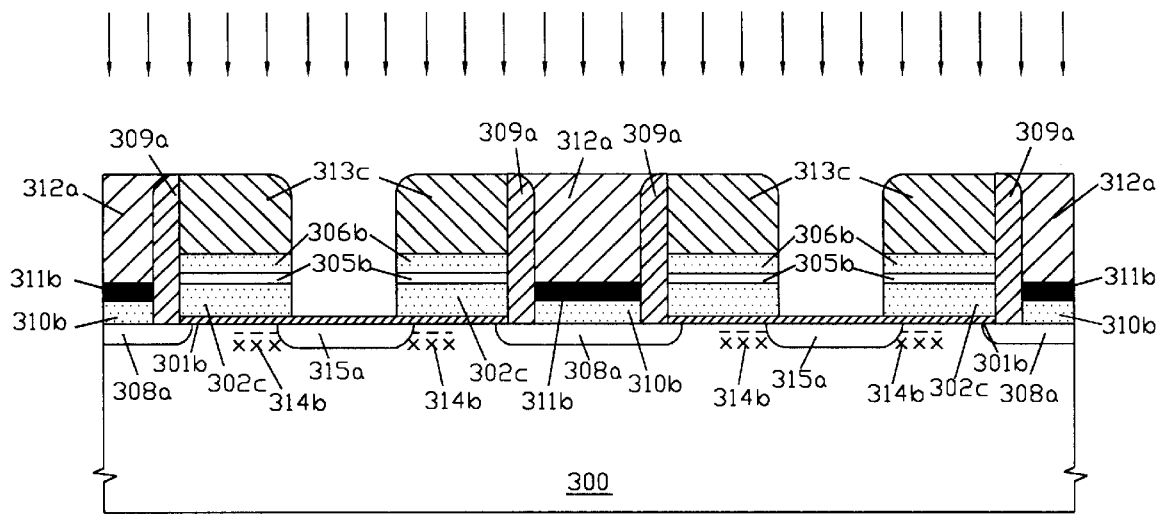
Figure 4J:
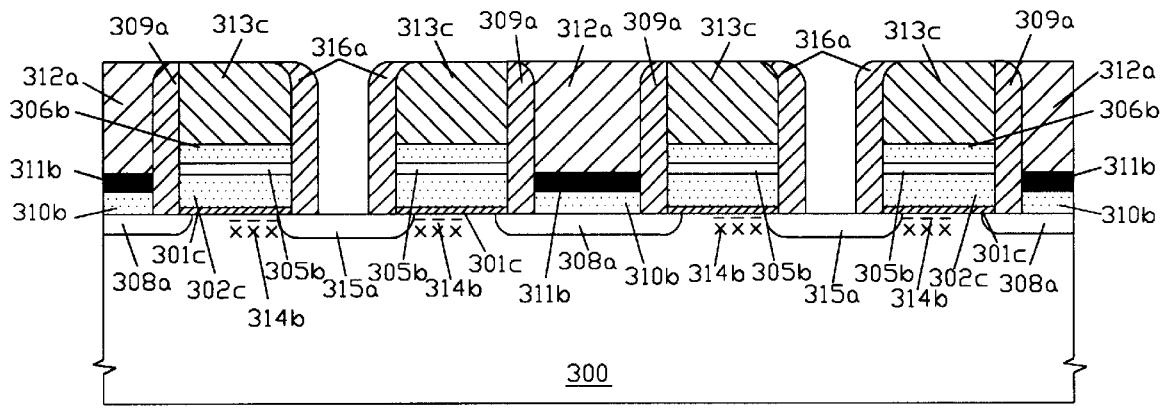
Figure 4K:
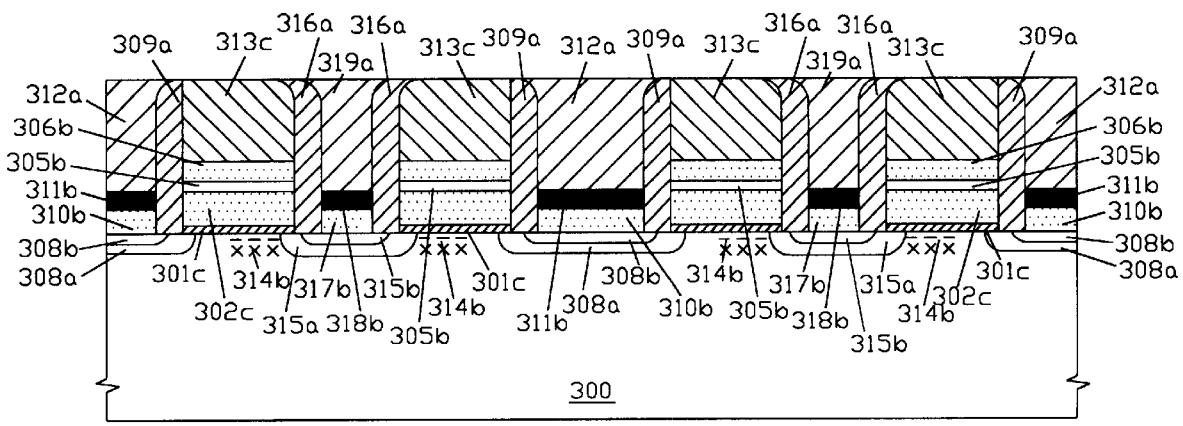
Figure 4L:
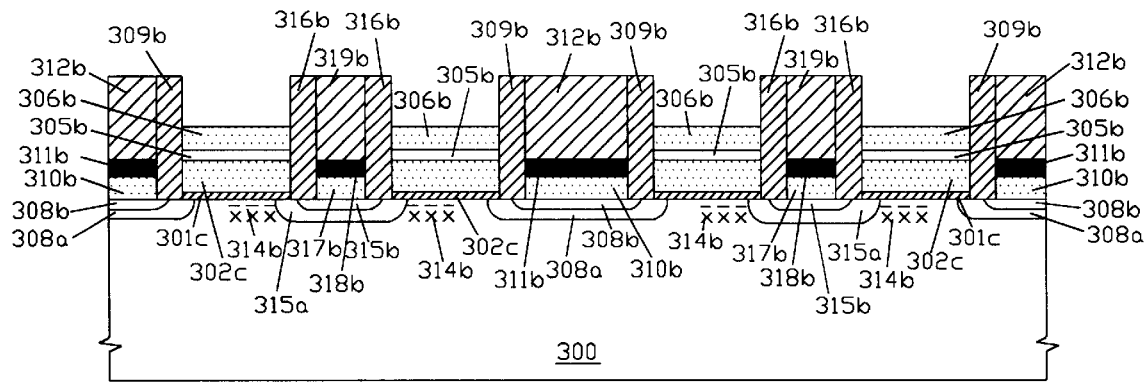
Figure 4M:
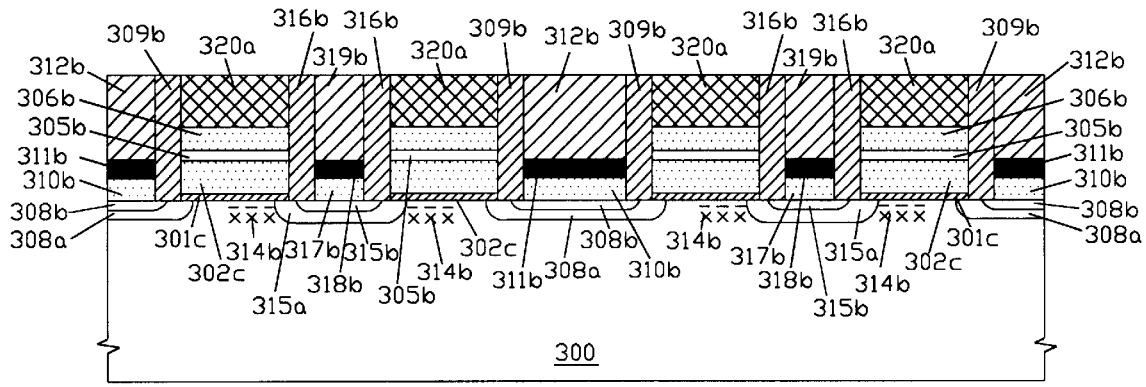
Figure 4N:
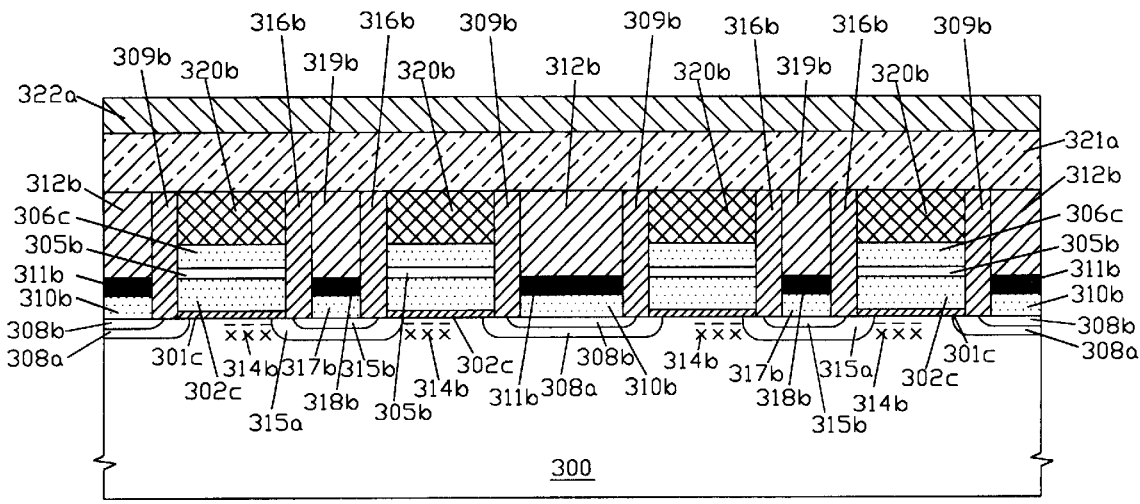

Referring now to FIG. 4A through FIG. 4N, there are shown the process steps and their cross-sectional views for fabricating a contactless scalable stack-gate flash memory array of the present invention. FIG. 4A shows that a plurality of patterned masking photoresist PR2 are formed over the second masking dielectric layer 307 to define a plurality of virtual gate regions (VGR) being formed under PR2 and a plurality of common-source regions (CSR) being formed between PR2. The width of a virtual gate region is XF and is scalable; the width of a common-source region is preferably a minimum-feature-size F.

FIG. 4B shows that the second masking dielectric layer 307, the second conductive layer 306, and the intergate dielectric layer 305 outside of PR2 are anisotropically removed first, then the raised field-oxide layers 304b are etched back to a level approximately equal to the top surface of the thin tunneling-dielectric layer 301a, and the first conductive layers 302a are subsequently removed by anisotropic dry etching, then the patterned masking photoresist PR2 are stripped. An ion-implantation is performed by implanting doping impurities across the thin tunneling-dielectric layer 301a into the semiconductor substrate 300 in a self-aligned manner to form a plurality of common-source diffusion regions 308a of a second conductivity type. The common-source diffusion region 308a can be lightly-doped, moderately-doped or heavily-doped.

FIG. 4C shows that the thin tunneling-dielectric layer 301a is removed by dipping in dilute hydrofluoric acid and the etched raised field-oxide layer is also etched to form a first flat bed being alternately formed by a common-source diffusion region 308a and a first etched raised field-oxide layer 304c, and a pair of first sidewall dielectric spacers 309a are then formed over the sidewalls of the neighboring virtual gate regions and on a portion of the first flat bed. The first sidewall dielectric spacer 309a is formed by first depositing a dielectric layer 309 over the formed structure and then etching back the thickness of the deposited dielectric layer 309. The first sidewall dielectric layer 309a is preferably made of silicon-oxides as deposited by LPCVD and the spacer width is preferably between 200 Angstroms and 1000 Angstroms.

FIG. 4D shows that the planarized second conductive layers 310a are formed over the gaps between the pair of first sidewall dielectric spacers 309a and on the first flat beds and are then etched back to a level slightly lower than the top surface of the first conductive layer 302b, and subsequently an ion-implantation is performed by implanting a high dose of doping impurities into the etched-back second conductive layers 310b in a self-aligned manner. The planarized second conductive layer 310a is preferably made of doped polycrystalline-silicon as deposited by LPCVD and is formed by first depositing a thick second conductive layer 310 over the formed structure and then planarizing the deposited thick second conductive layer 310 using CMP with the second masking dielectric layer 307a as a polishing stop. It should be noted that the heavily-implanted etched-back second conductive layer 310b is acted as a dopant diffusion source to form a shallow heavily-doped diffusion region 308b within a common-source diffusion region 308a later (see FIG. 4K).

FIG. 4E shows that a first metal-silicide layer 311b is formed over the etched-back second conductive layer 310b and a planarized thick-oxide layer 312a is then formed over the first metal-silicide layer 311b and the pair of first sidewall dielectric spacers 309a. The first metal-silicide layer 311b is formed by the well-known self-aligned silicidation process or is formed by first depositing a planarized metal-silicide layer 311a and then etching back the deposited planarized metal-silicide layer 311a. The first metal-silicide layer 311b is preferably made of tungsten-silicides or high melting-point metal-silicides. The planarized thick-oxide layer 312a is preferably made of silicon-oxides as deposited by LPCVD or high-density plasma CVD.

FIG. 4F shows that the second masking dielectric layers 307a are removed by using hot-phosphoric acid.

FIG. 4G shows that a pair of third sidewall dielectric spacers 313a are formed over the sidewalls being formed by the removed second masking dielectric layers 307a to define the low threshold-voltage stack-gate regions in each of virtual gate regions and an implanted region 314a of a first conductivity type is formed in each of virtual gate regions in a self-aligned manner by implanting doping impurities across the second conductive layer 306a, the intergate dielectric layer 305a, the first conductivity layer 302b, and the thin tunneling-dielectric layer 301b into the semiconductor substrate 300. The third sidewall dielectric spacer 313a is preferably made of silicon-nitrides as deposited by LPCVD and is formed by first depositing a dielectric layer 313 and then etching back the thickness of the deposited dielectric layer 313. Therefore, the spacer width can be controlled by the thickness of the deposited dielectric layer 313 and can be made to be much smaller than a minimum-feature-size(F) of technology used. The implanted region 314a may include a shallow implant region (as marked by the dash lines) for threshold-voltage adjustment and a deep implant region (as marked by the cross symbols) for forming a punch-through stop.

FIG. 4H(a) shows that another pair of third sidewall dielectric spacers 313b are formed over the formed pair of third sidewall dielectric spacers 313a to form a composite pair of third sidewall dielectric spacers 313c. FIG. 4H(b) shows that the pair of third sidewall dielectric spacers 313a are removed by using hot-phosphoric acid and a pair of fourth sidewall dielectric spacers 313c are formed. These two processes are mainly used to define the control-gate length of scalable stack-gate flash memory cells of the present invention.

FIG. 4I shows that the second conductive layers 306a and the intergate-dielectric layers 305a between the pair of third/fourth sidewall dielectric spacers 313c are anisotropically removed in sequence, the raised field-oxide layers 304b are selectively etched back to a level approximately equal to the top surface of the thin tunneling-dielectric layer 301b, and the first conductive layers 302b are then removed anisotropically; subsequently, an ion-implantation is performed across the thin tunneling-dielectric layers 301b in a self-aligned manner to form the common-drain diffusion regions 315a of a second conductivity type. The common-drain diffusion region 315a is preferably a heavily-doped diffusion region. It should be emphasized that if the implanted regions 314b aren't formed, then the common-drain diffusion region 315a is a double-diffused structure with a heavily-doped diffusion region of a second conductivity type being formed within a lightly-doped or moderately-doped diffusion region of a first conductivity type. These two doping structures are separately shown in FIG. 2C(a) and FIG. 2C(b).

FIG. 4J shows that the thin tunneling-dielectric layers 301b between the pair of third/fourth sidewall dielectric spacers 313c are removed by preferably dipping in dilute hydrofluoric acid and the etched raised field-oxide layers are further etched to form a second flat bed being formed alternately by a common-drain diffusion region 315a and a second etched raised field-oxide layers 304d and, subsequently, a pair of second sidewall dielectric spacers 316a are formed over the sidewalls of each pair of stack-gate transistors and on a portion of the second flat bed. The second sidewall dielectric spacer 316a is preferably made of silicon-oxides as deposited by LPCVD and its spacer width is preferably between 200 Angstroms and 1000 Angstroms.

FIG. 4K shows that a common-drain conductive bus line 317b is formed over each of second flat beds between the pair of second sidewall dielectric spacers 316a, a second metal-silicide layer 318b is formed over the common-drain conductive bus line 317b, and then a second planarized thick-oxide layer 319a is formed over the second metal-silicide layer 318b and the pair of second sidewall dielectric spacers 316a. The common-drain conductive bus line 317b is preferably made of doped polycrystalline-silicon as deposited by LPCVD and is heavily implanted with a high-dose of doping impurities to be acted as a dopant diffusion source for forming a shallow heavily-doping diffusion region 315b of a second conductivity type within the common-drain diffusion region 315a. The second metal-silicide layer 318b is preferably made of refractory-metal suicides such as titanium-silicide ($TiSi_2$), cobalt-silicide ($CoSi_2$), tantalum-silicide ($TaSi_2$), nickel-silicide ($NiSi_2$), molybdenum-silicide ($MoSi_2$), platinum-silicide ($PtSi_2$) and tungsten-silicide($WSi_2$). The planarized thick-oxide layer 319a is preferably made of silicon-oxides as deposited by high-density plasma CVD or CVD. It should be noted that a rapid thermal annealing process can be performed before forming the second metal-silicide layers 318b and the shallow heavily-doped diffusion regions 308b, 315b are separately formed within the common-source/drain diffusion regions 308a, 315a.

FIG. 4L shows that the first/second planarized thick-oxide layers 312a, 319a and the first/second sidewall dielectric spacers 309a, 316a are etched back to a depth of approximately between 300 Angstroms and 1000 Angstroms and the third or fourth sidewall dielectric spacers 313c are selectively removed by hot-phosphoric acid.

FIG. 4M shows that a planarized third conductive layer 320a is formed to fill up the gaps being formed by the removed third or fourth sidewall dielectric spacers 313c. The planarized third conductive layer 320a is preferably a composite conductive layer such as a tungsten or tungsten-silicide layer over a barrier-metal layer such as titanium-nitride or tantalum-nitride. It is preferable that a silicide layer such as titanium-silicide or cobalt-silicide is formed on the second conductive layers 306b by using a well-known self-aligned silicidation process before depositing the barrier-metal layer as a liner.

FIG. 4N shows that a first interconnect metal layer 321 is formed over the structure and a set of hard masking layers with each hard masking layer being formed by a third masking dielectric layer 322a and its two sidewall dielectric spacers 323a are formed over the first interconnect metal layer 321 to simultaneously pattern and etch the first interconnect metal layer 321, the planarized third conductive layers 320a and the second conductive layers 306b to form a plurality of word lines perpendicularly to the plurality of common-source/drain conductive bus lines 310b, 317b. The first interconnect metal layer 321a is preferably an aluminum or copper layer on a barrier-metal layer such as TiN or TaN. The third masking dielectric layer 322a and its two sidewall dielectric spacers 323a are preferably made of silicon-nitrides or silicon-oxides as deposited by LPCVD. The cross-sectional views of FIG. 4N as also indicated in FIG. 2B are shown in FIG. 2D through FIG. 2G. It should be emphasized again that if the implanted regions 314b aren't formed, the common-drain diffusion region 315a is a double-diffused structure having a heavily-doped diffusion region of a second conductivity type formed within a lightly-doped or moderately-doped diffusion region of a first conductivity type. Therefore, there are two kinds of stack-gate transistor cells as shown in FIG. 2C(a) and FIG. 2C(b). It is clearly seen that no additional masking steps are required to implement the implanted regions 314b or the double-diffused drain structure, as compared to the prior arts.

While the present invention has been particularly shown and described with a reference to the present examples and embodiments as considered as illustrative and not restrictive. Moreover, the present invention is not limited to the details given herein, it will be understood by those skilled in the art that various changes in form and details may be made without departure from the true spirit and scope of the present invention.

What is claimed is:

1. A scalable stack-gate flash memory cell, comprising:
   a semiconductor substrate of a first conductivity type;
   a cell region having an active region and two shallow-trench-isolation (STI) regions formed on said semiconductor substrate and being divided into three regions: a common-source region, a gate region, and a commond-rain region, wherein said gate region is located between said commonsource region and said common-drain region with its control-gate length being defined by a sidewall dielectric spacer-being formed over a sidewall of said common-source region and said shallow-trench-isolation region is filled with a raised field-oxide layer;
   a common-source diffusion region of a second conductivity type being formed in said semiconductor substrate by implanting doping impurities in a self-aligned manner into said active region in said common-source region;

a first flat bed being formed by said common-source diffusion region and nearby first etched raised field-oxide layers and a first sidewall dielectric spacer being formed over a sidewall of said gate region and on a portion of said first flat bed;

a common-source conductive layer being formed over said first flat bed outside of said first sidewall dielectric spacer and a first planarized thick-oxide layer being formed over said common-source conductive layer and said first sidewall dielectric spacer;

a common-drain diffusion region being formed in said semiconductor substrate by implanting doping impurities in a self-aligned manner into said active region in said common-drain region;

a second flat bed being formed by said common-drain diffusion region and nearby second etched raised field-oxide layers and a second sidewall dielectric spacer being formed over another sidewall of said gate region and on a portion of said second flat bed;

a common-drain conductive layer being formed over said second flat bed outside of said second sidewall dielectric spacer and a second planarized thick-oxide layer being formed over said common-drain conductive layer and said second sidewall dielectric spacer; and a scalable stack-gate structure being formed in said gate region and comprising from top to bottom a planarized control-gate, an intergate dielectric layer, a floating gate, and a thin tunneling-dielectric layer being formed on said semiconductor substrate.

2. The scalable stack-gate flash memory cell according to claim 1, wherein said common-source/drain conductive layer is made of doped polycrystalline-silicon and is further heavily implanted with a high dose of doping impurities to be acted as a dopant diffusion source for forming a shallow heavily-doped diffusion region of a second conductivity type within said common-source/drain diffusion region and said common source/drain conductive layer is preferably capped with a first/second metal-silicide layer.

3. The scalable stack-gate flash memory cell according to claim 1, wherein said first/second sidewall dielectric spacer is preferably made of siliconoxides as deposited by low-pressure chemical-vapor-deposition (LPCVD) and said sidewall dielectric spacer is preferably made of siliconnitrides as deposited by LPCVD.

4. The scalable stack-gate flash memory cell according to claim 1, wherein said common-drain diffusion region is a heavily-doped diffusion region of said second conductivity type.

5. The scalable stack-gate flash memory cell according to claim 1, wherein said common-drain diffusion region is a double-diffused structure having a heavily-doped diffusion region of said second conductivity type formed within a lightly-doped or moderately-doped diffusion region of said first conductivity type.

6. The scalable stack-gate flash memory cell according to claim 1, wherein an implanted region of said first conductivity type being formed in a part of said semiconductor substrate of said gate region is formed through a mask being formed by a third sidewall dielectric spacer formed over said sidewall of said common-source region and comprises a shallow implant region for threshold-voltage adjustment and a deep implant region for forming a punch-through stop, and said third sidewall dielectric spacer is made of silicon-nitrides as deposited by LPCVD.

7. The scalable stack-gate flash memory cell according to claim 1, wherein said planarized control-gate comprises a tungsten-silicide or tungsten layer being formed over a barrier-metal layer and a titanium-silicide (TiSi2) or cobalt-silicide (COSi2) layer being formed on a doped polycrystalline-silicon or doped amorphous-silicon layer, and said barrier-metal layer is titanium-nitride (TiN) or tantalum-nitride (TaN) layer.

8. The scalable stack-gate flash memory cell according to claim 1, wherein a first interconnect metal layer being formed over said first planarized thick-oxide layer, said planarized control-gate, and said second planarized thick-oxide layer is patterned by a masking dielectric layer being formed above said active region and its two sidewall dielectric spacers to simultaneously etch said first interconnect metal layer and said planarized control-gate for forming a word line transversely to said commonsource/drain conductive layer, and said masking dielectric layer and said two sidewall dielectric spacers are made of silicon-nitrides or silicon-oxides as deposited by LPCVD.

9. A scalable stack-gate flash memory cell, comprising:

a semiconductor substrate of a first conductivity type;

a cell region having an active region and two shallow-trench-isolation (STI) regions formed on said semiconductor substrate and being divided into three regions: a common-source region, a gate region, and a commond-rain region, wherein said gate region is located between said commonsourcc region and said common-drain region with its control-gate length being defined by a sidewall dielectric spacer being formed over a sidewall of said common-source region and each of said shallow-trenchisolation regions is filled with a raised field-oxide layer;

a common-source diffusion region of a second conductivity type being formed in said semiconductor substrate by implanting doping impurities in a self-aligned manner into said active region in said common-source region;

a first flat bed being formed by said common-source diffusion region and nearby first etched raised field-oxide layers and a first sidewall dielectric spacer being formed over a sidewall of said gate region and on a portion of said first flat bed;

a common-source conductive layer being formed over said first flat bed outside of said first sidewall dielectric spacer and a first planarized thick-oxide layer being formed over said common-source conductive layer and said first sidewall dielectric spacer;

a common-drain diffusion region of a second conductivity type being formed in said semiconductor substrate by implanting doping impurities in a self-aligned manner into said active region in said common-drain region; a second flat bed being formed by said common-drain diffusion region and nearby second etched raised field-oxide layers and a second sidewall dielectric spacer being formed over another sidewall of said gate region and on a portion of said second flat bed; a common-drain conductive layer being formed over said second flat bed outside of said second sidewall dielectric spacer and a second planarized thick-oxide layer being formed over said common-drain conductive layer and said second sidewall dielectric spacer; and a scalable stack-gate structure being formed in said gate region and comprising from top to bottom a planarized control-gate, an intergate dielectric layer, a floating gate, and a thin tunneling-dielectric layer being formed on said semiconductor substrate, wherein an implanted region of said first conductivity type being formed in a part of said semiconductor substrate of said gate region is implanted through a mask being formed by a third sidewall dielectric spacer formed over said sidewall of said commonsource region and comprises a shallow implant region for threshold-voltage adjustment and a deep implant region for forming a punch-through stop.

10. The scalable stack-gate flash memory cell according to claim 9, wherein said common-source/drain conductive layer is made of doped polycrystalline-silicon and is further heavily implanted with a high dose of doping impurities to be acted as a dopant diffusion source for forming a shallow heavily-doped diffusion region of said second conductivity type within said common-source/drain diffusion region and said common source/drain conductive layer is capped with a first/second metal-silicide layer.

11. The scalable stack-gate flash memory cell according to claim 9, wherein said first/second sidewall dielectric spacer is preferably made of silicon-oxides and said third sidewall dielectric spacer is made of silicon-nitrides.

12. The scalable stack-gate flash memory cell according to claim 9, wherein said common-source diffusion region is a lightly-doped, moderately doped, or heavily-doped diffusion region and said commondrain diffusion region is preferably a heavily-doped diffusion region.

13. The scalable stack-gate flash memory cell according to claim 9, wherein said planarized control-gate comprises a tungsten silicide or tungsten layer being formed over a barrier-metal layer and a titaniumsilicide (TiSi2) or cobalt-silicide (COSi2) layer being formed on a doped polycrystalline-silicon or doped amorphous-silicon layer, and said barriermetal layer is a titanium-nitride (TiN) or tantalum-nitride (TaN) layer.

14. The scalable stack-gate flash memory cell according to claim 9, wherein a first interconnect metal layer being formed over said first planarized thick-oxide layer said planarized control-gate, and said second planarized thick-oxide layer is patterned by a masking dielectric layer being formed above said active region and its two sidewall dielectric spacers to simultaneously etch said first interconnect metal layer and said planarized control-gate for forming a word line transversely to said common-source/drain conductive layer, and said masking dielectric layer and said two sidewall dielectric spacers are made of siliconnitrides or silicon-oxides as deposited by LPCVD.

15. The scalable stack-gate flash memory cell according to claim 9, wherein said sidewall dielectric spacer is made of silicon nitrides.

16. A contactless scalable stack-gate flash memory array, comprising: a semiconductor substrate of a first conductivity type;
  a plurality of parallel shallow-trench-isolation (STI) regions and a plurality of active regions being formed alternately on said semiconductor substrate, wherein each of the plurality of parallel STI regions is filled with a raised field-oxide layer and each of the plurality of active regions is filled with a floating-gate layer being formed over a thin tunneling-dielectric layer;
  a plurality of virtual gate regions and a plurality of common-source bus-line regions being formed alternately over said semiconductor substrate and transversely to the plurality of parallel STI regions, wherein the plurality of virtual gate regions are patterned by a masking photoresist step and are therefore scalable;
  a plurality of common-source diffusion regions of a second conductivity type being formed by implanting doping impurities in a selfaligned manner into said semiconductor substrate of the plurality of active regions along the plurality of common-source bus-line regions;
  a first flat bed being formed in each of the plurality of common-source bus-line regions and being alternately formed by said common-source diffusion region and a first etched raised field-oxide layer, wherein a pair of first sidewall dielectric spacers are separately formed over each sidewall of nearby said virtual gate regions and on a portion of said first flat bed and each of the plurality of common-source bus-line regions comprises from top to bottom a first planarized thick-oxide layer being formed over said pair of first sidewall dielectric spacers and a common-source conductive bus line being formed over said first flat bed between said pair of first sidewall dielectric spacers;
  a scalable stack-gate region being formed in each side portion of said virtual gate region and a common-drain region being formed between said scalable stack-gate regions, wherein said scalable stack-gate region is defined by a fourth sidewall dielectric spacer being formed over a sidewall of said common-source bus-line region and comprises from top to bottom a planarized control-gate, an intergate dielectric layer, a floating-gate, and said thin tunneling-dielectric layer being formed on said semiconductor substrate;
  a plurality of common-drain diffusion regions being formed by implanting doping impurities in a self-aligned manner into said semiconductor substrate of the plurality of active regions along a plurality of common-drain bus-line regions;
  a second flat bed being formed in each of the plurality of commondrain bus-line regions and being alternately formed by said common-drain diffusion region and a second etched raised field-oxide layer, wherein a pair of second sidewall dielectric spacers are formed over each sidewall of nearby said scalable stack-gate regions and on a portion of said second flat bed and each of the plurality of common-drain bus-line regions comprises from top to bottom a second planarized thick-oxide layer being formed over said pair of second sidewall dielectric spacers and a common-drain conductive bus line being formed over said second flat bed between said pair of second sidewall dielectric spacers; and
  a plurality of word lines being formed alternately above the plurality of active regions and transversely to the plurality of common-source/drain conductive bus lines and being electrically connected with said planarized control-gates along the plurality of active regions, wherein each of the plurality of word lines is formed by a first interconnect metal layer together with said planarized control-gates being simultaneously patterned and etched by a masking dielectric layer being located above said active region and two sidewall dielectric spacers being formed over said masking dielectric layer.

17. The contactless scalable stack-gate flash memory array according to claim 16, wherein said common-source/drain conductive bus line is made of doped polycrystalline-silicon as deposited by LPCVD and is further heavily implanted with a high dose of doping impurities to be acted as a dopant diffusion source for forming a shallow heavily-doped diffusion region of said second conductivity type within said commonsource/drain diffusion region and said common-source/drain conductive bus line is capped with a first/second metal-silicide layer.

18. The contactless scalable stack-gate flash memory array according to claim 16, wherein said common-drain diffusion region is preferably a heavily-doped diffusion region of said second conductivity type or a double-diffused structure having a heavily-doped diffusion region of said second conductivity type formed within a lightly-doped or moderately-doped diffusion region of said first conductivity type.

19. The contactless scalable stack-gate flash memory array according to claim 16, wherein an implanted region of said first conductivity type being formed in a part of said semiconductor substrate of said scalable stack-gate region is formed through a mask being formed by a third sidewall dielectric spacer formed over said sidewall of said common-source bus-line region and comprises a shallow implant region for threshold-voltage adjustment and a deep implant region for forming a punch-through stop.

20. The contactless scalable stack-gate flash memory array according to claim 16, wherein said first interconnect metal layer is preferably an aluminum or copper layer being formed over a barrier-metal layer and said masking dielectric layer and said two sidewall dielectric spacers are made of silicon-nitrides or silicon-oxides as deposited by LPCVD.

21. The contactless scalable stack-gate flash memory array according to claim 16, wherein said first/second sidewall dielectric spacer is made of silicon-oxides as deposited by LPCVD and said third sidewall dielectric spacer is made of silicon-nitrides as deposited by LPCVD.

* * * * *